United States Patent
Tamagaki et al.

(10) Patent No.: US 8,261,693 B2
(45) Date of Patent: Sep. 11, 2012

(54) ARC ION PLATING APPARATUS

(75) Inventors: Hiroshi Tamagaki, Takasago (JP); Hirofumi Fujii, Takasago (JP); Tadao Okimoto, Takasago (JP); Ryoji Miyamoto, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 12/953,926

(22) Filed: Nov. 24, 2010

(65) Prior Publication Data
US 2011/0067631 A1 Mar. 24, 2011

Related U.S. Application Data

(63) Continuation of application No. 11/532,778, filed on Sep. 18, 2006, now abandoned.

(30) Foreign Application Priority Data

Oct. 17, 2005 (JP) .................................. 2005-301433

(51) Int. Cl.
*C23C 14/48* (2006.01)
(52) U.S. Cl. ................................. 118/723 VE
(58) Field of Classification Search ............. 118/723 VE
See application file for complete search history.

(56) References Cited

U.S. PATENT DOCUMENTS 5,618,590 A 4/1997 Naruse et al.

FOREIGN PATENT DOCUMENTS

| CN | 1137572 A | 12/1996 |
| JP | 4-276062 | 10/1992 |
| JP | 10-46324 | 2/1998 |
| JP | 2001-152320 | 6/2001 |
| JP | 2004-225065 | 8/2004 |

OTHER PUBLICATIONS

Huang R F et al: "Wear-resistant multilayered diamond-like carbon coating prepared by pulse biased arc ion plating" Diamond and Related Materials, Elsevier Science Publishers, Amsterda, NL, vol. 10, No. 9-10, Sep. 1, 2001, pp. 1850-1854, XP004321135 ISSN: 0925-9635 *p. 1851, left-hand column, paragraph 3 right-hand column, paragraph 2; figure 1.
Lee Ho Y et al: "Structure and properties of WC-CrALN superlattice films by cathodic arc ion plating process" Thin Solid Films, Elsevier-Sequoia S.A. Lausanne, CH, vol. 420-421, Dec. 2, 2002, pp. 414-420, XP004397882 ISSN: 0040-6090 *p. 415, left-hand column, paragraph 2 right-hand column, Paragraph 1: figure 1.

*Primary Examiner* — Sylvia R. MacArthur
(74) *Attorney, Agent, or Firm* — Oblon, Spivak, McClelland, Maier & Neustadt, L.L.P.

(57) ABSTRACT

An arc ion plating apparatus comprises a vacuum chamber, a rotary table for moving a substrate within the vacuum chamber vertically relative to its height direction, an arc evaporation source for bombardment for cleaning the surface of the substrate with metal ions, and an arc evaporation source for deposition group for depositing metal ions on the surface of the substrate. The arc evaporation source for deposition group is composed of a plurality of evaporation sources arranged so as to be opposite to the substrate set on the rotary table, and the arc evaporation source for bombardment is arranged so as to be opposite to the substrate, and formed so that its length in the height direction of the vacuum chamber is equal to the length between the upper and lower ends of the arc evaporation source for deposition group. According to such a structure, over temperature rise or abnormal discharge is hardly caused in the substrate at the time of bombardment, and process controllability is consequently enhanced.

11 Claims, 9 Drawing Sheets

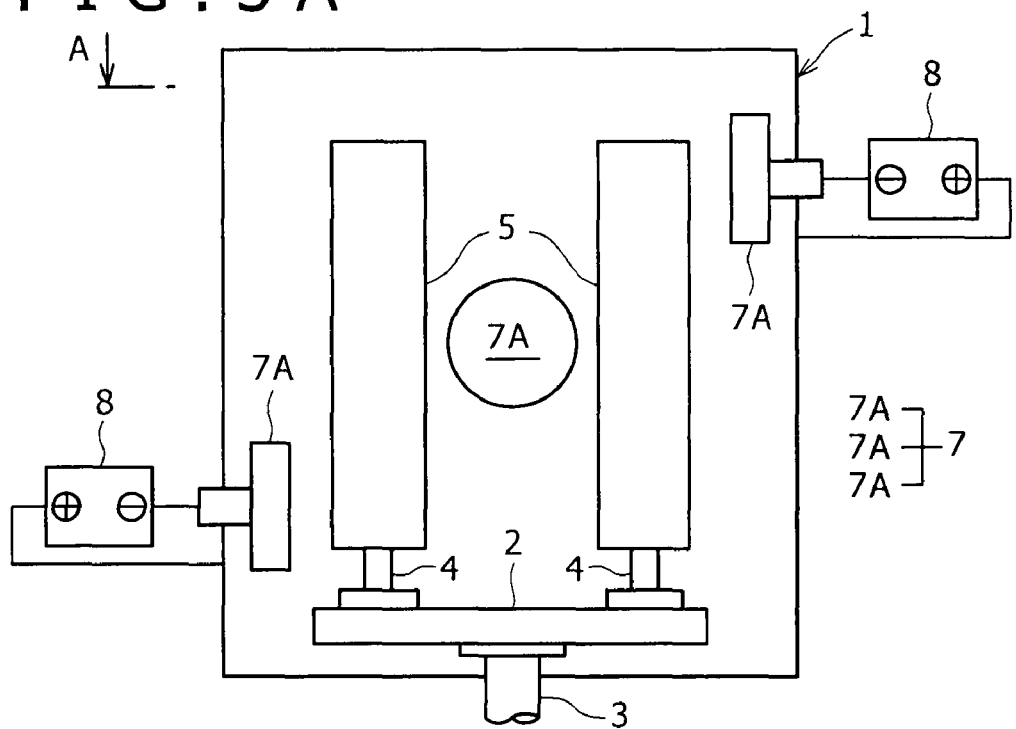
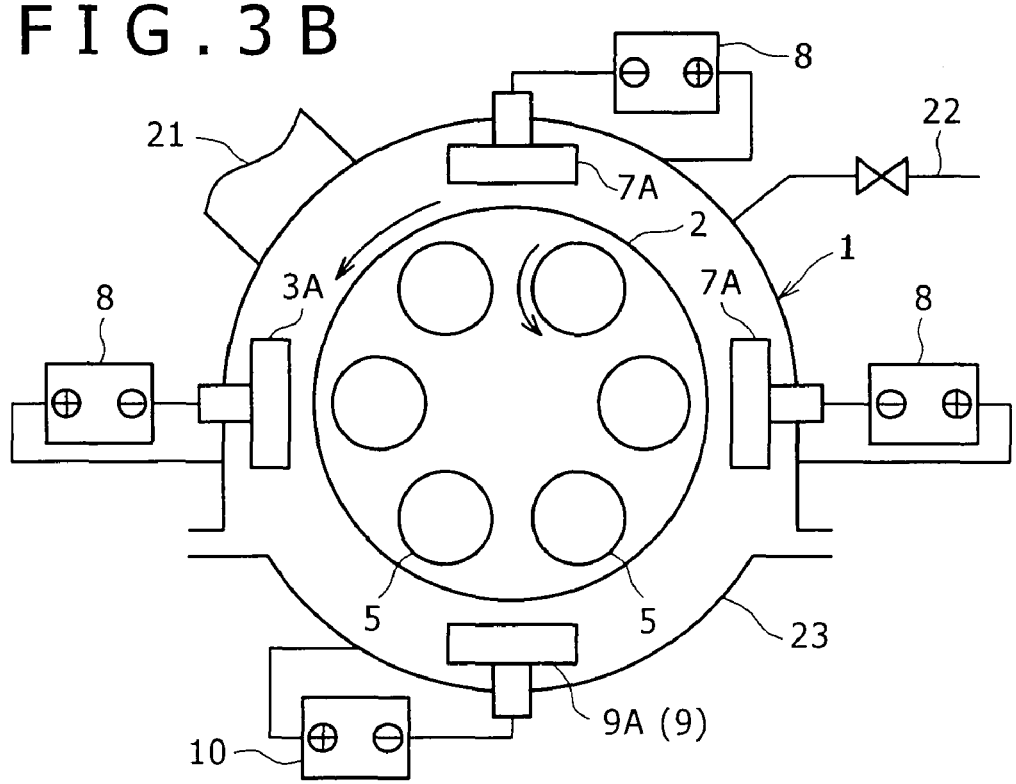

FIG.9A
FIG.9B
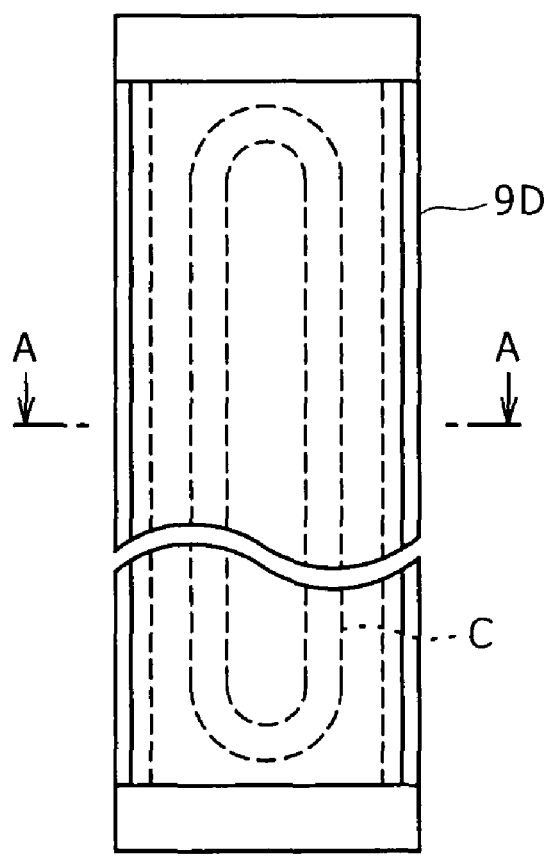
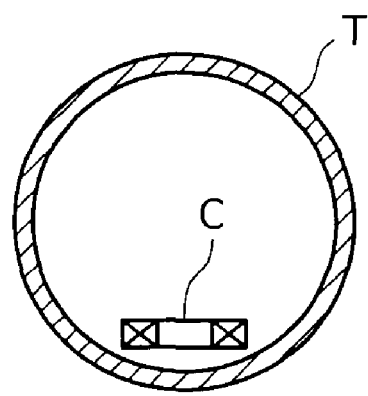

ARC ION PLATING APPARATUS

CROSS-REFERENCE TO RELATED APPLICATIONS

This application is a continuation of U.S. application Ser. No. 11/532,778, filed Sep. 18, 2006, the entire content of which is incorporated herein by reference, and claims priority under 35 U.S.C. 119 to Japanese Patent Application No. 2005-301433, filed Oct. 17, 2005.

BACKGROUND OF THE INVENTION

1. Field of the Invention

The present invention relates to an arc ion plating apparatus improved in stability of metal ion bombardment.

2. Description of the Related Art

In recent years, hard film deposition (TiN, TiAlN, CrN, etc.) by PVD has been performed to a substrate (film deposition object) for the purpose of improvement in wear resistance of a cutting tool or improvement in tribological characteristic of a sliding surface of a mechanical part. The industrial technique frequently used for such a hard film deposition is arc ion plating (hereinafter referred to as "AIP") which evaporates a film deposition material by vacuum arc discharge to form a film on a substrate surface, and an apparatus for performing such a film deposition is called an arc ion plating apparatus (hereinafter referred to as "AIP apparatus").

The AIP apparatus comprises, as shown in FIG. 10, a vacuum chamber 1, and a rotary table 2 arranged on the bottom of the vacuum chamber 1 so that the table upper surface is horizontal. The rotary table 2 is rotated by a rotating shaft 3, and a plurality of planetary shafts 4 protruded from the upper surface of the rotary table 2 also rotate around their own axis by a planetary gear mechanism provided within the rotary table 2. A substrate holder 5 for holding a substrate is detachably mounted on each planetary shaft 4. Therefore, each substrate holder 5 rotates around its own axis while moving horizontally by the rotation of the rotary table 2, and the substrate such as a tool, a die or a mechanical part held by this substrate holder 5 rotates around its own axis by the rotation of the substrate holder 5 while revolving by the rotation of the rotary table 2. Negative voltage is applied to the rotary table 2 by a bias power supply (not shown), and this negative voltage is applied, through the substrate holder 5, to the substrate loaded thereon.

An arc evaporation source for deposition group 7 composed of three evaporation sources 7A arranged in line at substantially fixed intervals in the height direction of the vacuum chamber 1 is provided on the side wall inner surface of the vacuum chamber 1, and the evaporation sources 7A are connected to negative electrodes of arc power supplies 8, respectively, with the positive electrodes thereof being connected to the vacuum chamber 1. In FIG. 10(B), denoted at 21 is a pumping port for evacuating the vacuum chamber, 22 is a gas supply pipe for supplying a process gas such as nitrogen or oxygen (omitted in FIG. 10(A)), and 23 is an opening and closing door of the vacuum chamber.

A procedure for forming a functional film on the surface of a substrate using the AIP apparatus will be briefly described. The substrate is loaded on the substrate holder 5 and set on the rotary table 2, the vacuum chamber 1 is evacuated, the substrate is heated by a heater (not shown) provided within the vacuum chamber 1, and metal ion bombardment (hereinafter often simply referred to as "bombardment") is then performed to improve the adhesion of the film to be formed. The bombardment is a process for irradiating the substrate applied with a minus voltage of not less than several hundreds V (generally, 600 to 1000V) with metal ions evaporated from the evaporation sources 7A to etch the surface layer of the substrate by high-energy ion irradiation or to form a mixed layer of irradiation ions and the substrate.

After the end of bombardment, vapor of metal ions is generated from the evaporation sources 7A and irradiated to the substrate, and the voltage to be applied to the substrate is set to about 0 to −300V, whereby film deposition is started. Since a film to be formed by the AIP generally consists of a compound of a metal such as TiN, TiCN, CrN, TiAlN, TiC, or CrON with nitrogen, carbon, oxygen or the like, process gases such as nitrogen, oxygen, and hydrocarbon are introduced into the vacuum chamber 1 singly or in combination thereof during film deposition. For example, introduction of nitrogen with evaporation of Ti results in film deposition of TiN (titanium nitride).

Since the substrate loaded on the substrate holder 5 performs revolution and rotation by rotation of the rotary table 2 in the bombardment and the film deposition, uniform ion irradiation can be performed to the whole substrate.

After film deposition, cooling is performed, the vacuum chamber 1 is opened, and the substrate with a film formed thereon is taken out with the substrate holder 5 to recover the film-formed substrate after film deposition.

While the above-mentioned AIP apparatus performs the bombardment and the functional film deposition by use of the arc evaporation source for deposition group 7, Japanese Patent Laid-Open No. Hei 4-276062 discloses an AIP apparatus comprising an arc evaporation source for deposition and an arc evaporation source for bombardment of the same shape as this, which are provided within a vacuum chamber. According to this apparatus, since high-melting point metal or high-mass metal can be used as the evaporating material for arc evaporation source for bombardment even in use of low-melting point metal (e.g., TiAl alloy) as the evaporating material for arc evaporation source for deposition, the problem that the low-melting point metal disables effective bombardment treatment because of its reduced ionization ratio, and the problem of the deposition of droplets to the substrate surface can be solved.

It is known that there is a minimum arc current in order to stably operate the arc evaporation source for deposition and the arc evaporation source for bombardment, regardless of the size of evaporating surface. This minimum current is varied depending on the evaporating material and gas atmosphere. When a material such as Ti or TiAl alloy is used as the evaporating material for hard film deposition, generally, a current of at least about 80 A is needed in an environment to which gas is hardly introduced or in an environment for performing bombardment, and a current value smaller than this makes arc discharge unstable. In the bombardment process, metal ions are generated from an evaporation source in a state where a negative voltage of not less than several hundreds V (in general, about −600 to −1000V) is applied to the substrate. However, since the lower limit of arc current to evaporation source is defined for stable operation as described above, the irradiation quantity of metal ions also inevitably reaches a certain quantity.

Therefore, there is the following problem in the bombardment. Stable arc discharge requires an increased energy input quantity to substrate even with a minimum current value and, particularly, in a substrate with small heat capacity such as a drill with small diameter, the substrate temperature is rapidly raised. In order to prevent such an over-temperature rise, process conditions must be controlled in a short-time unit, such that the bombardment time is set to a short time to repeat bombardment with cooling interval. Therefore, the controllability is poor, and productivity is consequently reduced.

Further, as the arc evaporation source, two or more evaporation sources of relatively small size with a diameter of about 50 to 180 mm, typically with a diameter of about 100 to 150 mm are frequently used. However, since simultaneous operation of a number of evaporation sources requires a bias power supply of large capacity, and causes irradiation-off of a large quantity of metal ions, the problem of frequent occurrence of abnormal discharge on substrate is caused, in addition to the over-temperature rise of substrate. Since the bias power supply temporarily stops output in the event of abnormal discharge, an accurate bombardment process cannot be executed if abnormal discharge frequently occurs in course of short-time bombardment.

SUMMARY OF THE INVENTION

From the viewpoint of the above-mentioned problems, the present invention has an object to provide an AIP apparatus which hardly causes over-temperature rise or abnormal discharge on substrate at the time of bombardment, and thus has satisfactory process controllability.

The AIP apparatus according to the present invention comprises a vacuum chamber; a moving member for moving a substrate loaded within the vacuum chamber which is provided within the vacuum chamber and moves the substrate in the direction vertically to the height direction of the vacuum chamber; an arc evaporation source for bombardment provided within the vacuum chamber for irradiating metal ions evaporated by arc discharge with the surface of the substrate to clean the surface, and arc evaporation sources for deposition provided within the vacuum chamber for depositing metal ions evaporated by arc discharge on the surface of the substrate, wherein the arc evaporation source for deposition makes up an arc evaporation source for deposition group composed of a plurality of the arc evaporation sources for deposition arranged in opposition to the substrate installed in the moving member without mutually overlapping in the height direction of the vacuum chamber; the arc evaporation source for bombardment makes up an arc evaporation source for bombardment group composed of at least one arc evaporation source arranged in opposition to the substrate without mutually overlapping in the height direction of the vacuum chamber; and the length in a direction vertical to the height direction of the arc evaporation source for bombardment is longer than that of the arc evaporation source for deposition.

According to this AIP apparatus, since the length of the vacuum chamber in the vertical direction is longer than that of the arc evaporation source for deposition, the metal ion irradiation quantity per unit length in the vertical direction of the arc evaporation source for bombardment, relative to a minimum current value necessary for stabilization of arc discharge, can be reduced, compared with the same ion irradiation quantity of the arc evaporation source for deposition. According to this, the heat input quantity to substrate and thus the over-temperature rise or abnormal discharge on substrate can be suppressed at the time of bombardment, resulting in improvement in process controllability.

The length in the height direction of the vacuum chamber of the arc evaporation source for bombardment is preferably three times more than the length in the same direction of the arc evaporation source for deposition, or preferably 0.5 to 2.0 m.

As the arc evaporation source for deposition, one typically having a circular evaporation surface, with a diameter of about 50 to 180 mm, typically of about 100 to 150 mm, is frequently adapted. Therefore, by using an evaporation source having a length of three times more than that of the arc evaporation source for deposition or a length of not less than 0.5 m for bombardment, the metal ion irradiation quantity at the minimum arc current value for stable operation can be reduced to about ⅓ per irradiation area width in the height direction of the vacuum chamber, compared with a case using the arc evaporation source for deposition for bombardment, and the heat input quantity can also be reduced to the same level. The evaporating material (target) becomes difficult to manufacture if the length of the evaporation source exceeds 2 m. Therefore, the length is preferably controlled to not more than 2 m.

The arc evaporation source for bombardment preferably includes a target formed of an evaporation material, with an electromagnetic coil formed long in the height direction of the vacuum chamber being attached to the back side of the target. Such an electromagnetic coil enables scanning of arc spot in a race track shape long in the length direction of the evaporation surface, resulting in uniform supply of metal ions to substrate at the time of bombardment. Further, it enables uniform wear of the evaporation surface of the target from an economical point of view.

As the above-mentioned substrate, a drill with small diameter is suitable. According to the AIP apparatus of the present invention, cutting failure that would be caused by softening of cutting edge can be prevented, and satisfactory cutting performance can be ensured.

According to the AIP apparatus of the present invention, the metal ion irradiation quantity per unit length in the vertical direction of the arc evaporation source for bombardment, relative to a minimum current value necessary for stabilization of arc discharge, can be reduced, compared with the same ion irradiation quantity of the arc evaporation source for deposition. Therefore, the heat input quantity to substrate and thus the over-temperature rise or abnormal discharge on substrate can be suppressed at the time of bombardment, resulting in improvement in process controllability.

Further, in a more essential viewpoint, means for solving the problems according to the present invention is to set the evaporation source area of one arc evaporation source for bombardment larger than that of one arc evaporation source for deposition. This structure is capable of reducing the metal ion irradiation quantity per unit area of the substrate by the arc evaporation source for bombardment, compared with that by the arc evaporation source for deposition. Accordingly, the heat input quantity to substrate and thus the over-temperature rise or abnormal discharge on substrate can be suppressed at the time of bombardment in which the minimum current value necessary for stabilization of arc discharge is relatively large.

BRIEF DESCRIPTION OF THE DRAWINGS

FIGS. 3(A) and (B) schematically illustrate an AIP apparatus according to a third embodiment of the present invention, wherein (A) is a vertically sectional side view of a vacuum chamber, and (B) is a plan view thereof taken from arrowed direction A of (A);

FIGS. 9(A) and (B) illustrate an arc evaporation source for bombardment provided with an electromagnetic coil and a cylindrical target, wherein (A) is a front view of the arc evaporation source for bombardment and (B) is a sectional view thereof taken along line A-A of (A)

DESCRIPTION OF THE PREFERRED EMBODIMENTS

Embodiments of the AIP apparatus according to the present invention will next be described with reference to the drawings.

Figure 1A:
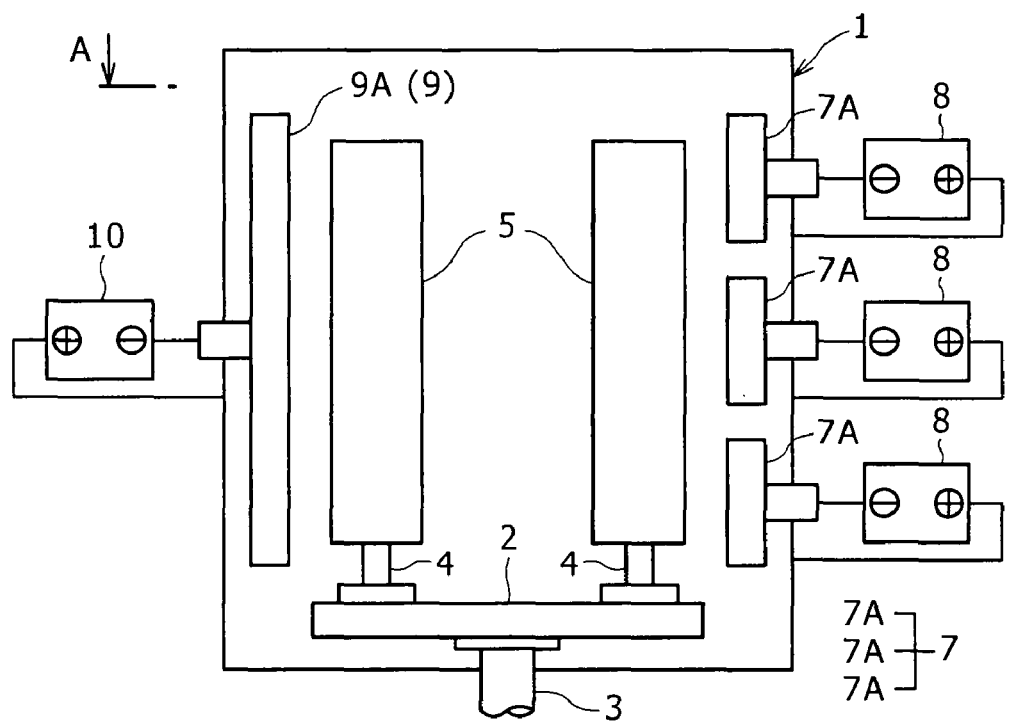
FIGS. 1(A) and (B) schematically illustrate an AIP apparatus according to a first embodiment of the present invention, wherein (A) is a vertically sectional side view of a vacuum chamber, and (B) is a plan view thereof taken from arrowed direction A of (A)
Figure 1B:
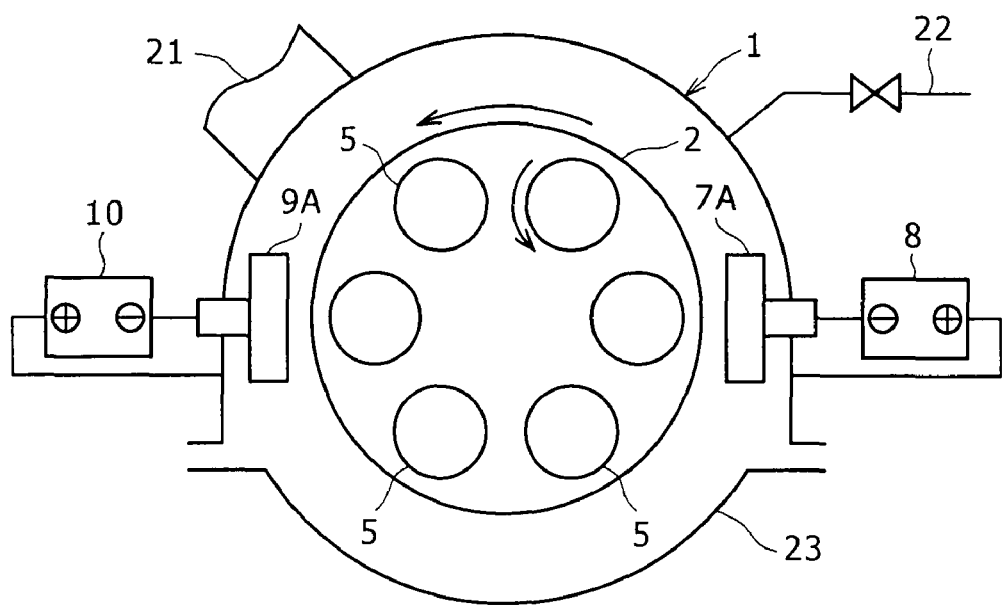
Figure 10A:
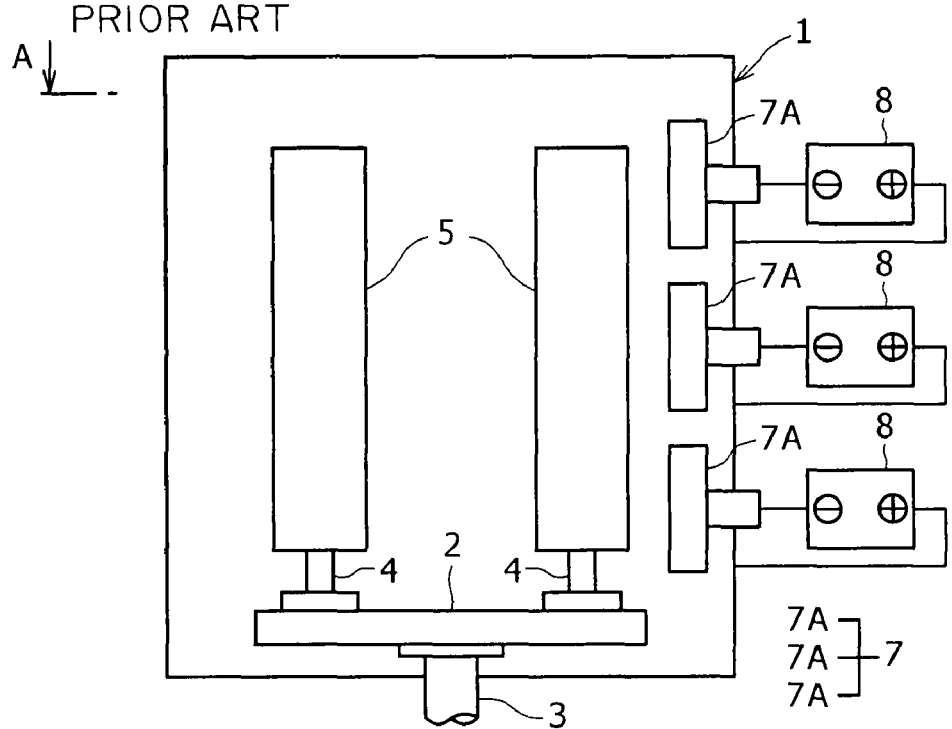
FIGS. 10(A) and (B) schematically illustrate a conventional AIP apparatus, wherein (A) is a vertically sectional side view of a vacuum chamber, and (B) is a plan view thereof taken from arrowed direction A of (A).
Figure 10B:
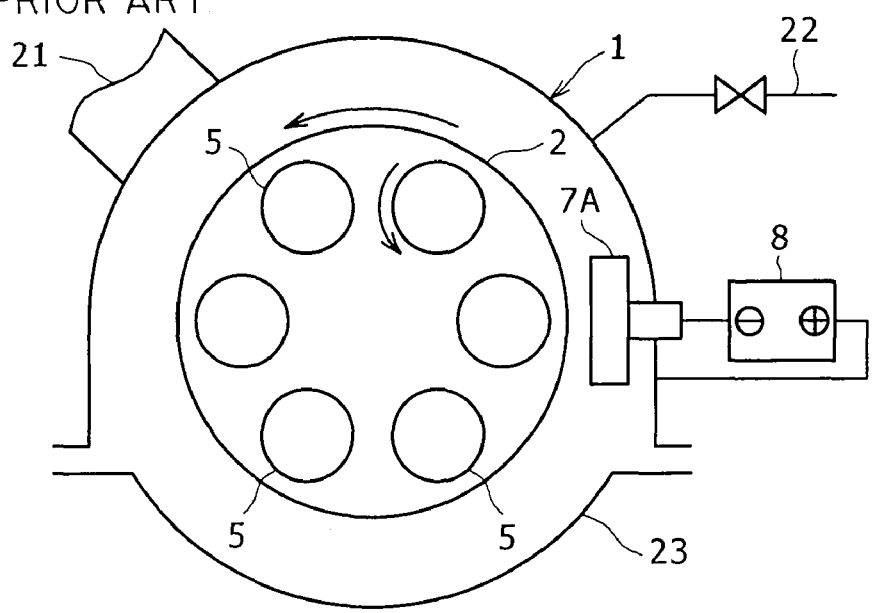

FIGS. 1(A) and (B) illustrate an AIP apparatus according to a first embodiment, and the same reference numbers are assigned to the same members as in the conventional AIP apparatus shown in FIGS. 10(A) and (B).

This AIP apparatus comprises a vacuum chamber 1, and a rotary table 2 (corresponding to the "moving member" of the present invention) is provided on the bottom of the vacuum chamber 1 so that the table upper surface is horizontal. The rotary table 2 is adapted so that it is rotated by a rotating shaft 3 whose central axis is arranged along the height direction (which may be called "longitudinal direction") of the vacuum chamber 1, and planetary shafts 4 protruded from the upper surface of the rotary table 2 rotate around their own axis by a planetary gear mechanism provided within the rotary table 2. A substrate holder 5 for holding a substrate is detachably mounted on each of the planetary shafts 4. Therefore, each substrate holder 5 horizontally moves in a vertical direction relative to the longitudinal direction (which may be called "lateral direction") by rotation of the rotary table 2, and also rotates around its own axis, and the substrate held by the substrate holder 5 while revolving by the rotation of the rotary table 2. Negative voltage is applied to the rotary table 2 by a bias power supply (not shown), and this negative voltage is then applied through the substrate holder 5 to a substrate loaded thereon. The rotary table 2 can be provided with no planetary gear mechanism so as not to rotate the substrate holders, or can be adapted to directly set the substrate on the rotary table without using the substrate holder.

A plurality (three in the figure) of evaporation sources 7A are arranged, as an arc evaporation source for deposition group 7, on the side wall inner surface of the vacuum chamber 1 substantially at fixed intervals in the height direction of the vacuum chamber 1. On the other hand, one evaporation source 9A having a rectangular shape in plan view is arranged, as an arc evaporation source for bombardment group 9, on the side wall inner surface opposite to the arc evaporation source for deposition group 7. The evaporation sources 7A and 9A are connected, respectively, to negative electrodes of arc voltages 8 and 10, with the positive electrodes thereof being connected to the vacuum chamber 1. Otherwise, anode electrode members may be provided in the vicinity of the evaporation sources 7A and 9A to connect the positive electrodes of the arc power supplies thereto.

As the evaporation sources 7A of the arc evaporation source for deposition group 7, those typically having a circular evaporation surface, with a diameter ranging from about $\phi$50 to 180 mm, typically ranging from $\phi$100 to 150 mm, are frequently used. Considering that metal ion vapor evaporated from the evaporation sources slightly spreads, the evaporation sources 7A are arranged at intervals of about 1.5 to 2.5 times the evaporation surface area diameter. Vacuum arc discharge is generated in the evaporation sources 7A with an arc current generally of 50 to 300 A, more generally, of about 80 to 150 A and an arc voltage of about 15 to 40V to evaporate targets (evaporating materials) attached to the evaporation sources 7A, so that metal ions are irradiated and deposited on the substrates.

Figure 6:
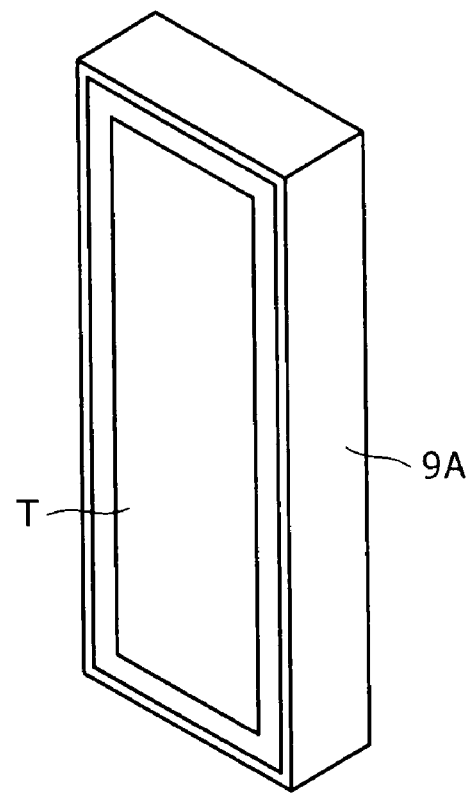
FIG. 6 is a perspective view of an arc evaporation source for bombardment having a rectangular shape in plan view.

On the other hand, the evaporation source 9A used as the arc evaporation source for bombardment group 9 has a rectangular shape in plan view with the long sides being longitudinally arranged and the short sides being laterally arranged, as shown in FIG. 6, and the evaporation surface of a target T that is an evaporating material also has a rectangular shape in plan view. The evaporation source 9A is adapted so that bombardment metal ions are supplied by one evaporation source 9A in a longitudinal metal ion irradiation area which can be treated by a plurality of evaporation sources 7A of the arc evaporation source for deposition group 7. The evaporation source 9A is arranged in opposition to the substrate within the vacuum chamber 1, and the upper and lower ends of its long side are located in positions corresponding to the upper end of the top evaporation source 7A of the arc evaporation source for deposition 7 and the lower end of the bottom evaporation source 7A, respectively. The lateral (short side) length of the evaporation source 9A is substantially the same as the diameter of the evaporation source 7A. An arc current area for operating the arc evaporation source for bombardment 9A is set to a range equal to that of each evaporation source 7A of the arc evaporation source for deposition group 7. According to this, the metal ion quantity per unit area to be irradiated to substrate can be reduced to about ⅓, and the heat input per unit time and per unit area to substrate surface in bombardment can be thus suppressed to about ⅓.

The arc discharge current in bombardment is preferably set so that one arc spot is mainly generated on the target surface for the purpose of ensuring the uniformity of bombardment, and preferably held in general at not more than 150 A, more preferably at not more than 120 A. On the other hand, since misfire of arc in course of bombardment is not preferred from the point of stability of arc discharge, the arc current is preferably set to not less than 80 A, at which arc discharge is stabilized.

The AIP apparatus of this embodiment is used in the same manner as in the past, except executing the bombardment by use of the arc evaporation source for bombardment group 9. Namely, the substrate holder 5 loaded with the substrate is set on the rotary table 2, the vacuum chamber 1 is evacuated, the substrate is heated by a heater provided within the vacuum chamber 1, bombardment is performed by use of the arc evaporation source for bombardment group 9, and a functional film is formed on the substrate surface by use of the arc evaporation source for deposition group 7.

Since the arc evaporation source for bombardment 9A formed so that its longitudinal length is larger than that of the arc evaporation source for deposition is used in the AIP apparatus of this embodiment, a sudden rise of substrate temperature at the time of bombardment can be suppressed and, overheating or the like, particularly, in a substrate with small heat capacity, which was problematic in the past, can be solved. Since the bombardment treatment can be performed by use of one evaporation source 9A, the capacity of the bias power supply can be minimized. Further, the frequency of abnormal discharge is reduced by the reduction in ion density in the vicinity of the substrate. And since the bombardment time necessary for obtaining the same bombardment effect is extended several times, the time of condition setting can be extended to improve the controllability, and the influence of interruption period of bias voltage in abnormal discharge can be relatively reduced.

As in the above-mentioned embodiment, it is effective for prevention of the overheating of substrate in bombardment that the longitudinal metal ion irradiation area width to be treated by one arc evaporation source for bombardment is set to not less than 400 mm and, more preferably, to not less than 500 mm. This is based on the experimental knowledge of the present inventors, and also matched with the following discussion. Namely, one of the reasons for setting the bias voltage for film deposition to a value up to −300V is prevention of the overheating of substrate. The arc current value for film deposition in an evaporation source with φ100 mm is 100 to 200A, typically 150A. Namely, three evaporation sources are operated with a bias voltage of 300V and an arc current of 150 A to irradiate metal ions in a longitudinal irradiation area width of 500 mm. In the bombardment process, the evaporation sources are operated with an arc current of 80 to 120 A, typically 100 A, considering the lower limit of arc current, to apply a bias voltage of −600 to −1000V to the substrate. When the maximum voltage is assumed in the same manner as in the film deposition, an arc current of 100 A and a bias voltage of 1000V are typical conditions in metal bombardment.

By the thought of (arc current)×(the number of evaporation sources)×(bias voltage)÷(longitudinal irradiation area width) as an instantaneous heat input quantity, an irradiation area width for bombardment where this value in bombardment is equal to the maximum value in film deposition (150 A×3× 300V/500 mm) can be determined as 370 mm by calculation. Namely, extension of the treatment area width in bombardment to this irradiation area width or more leads to reduction in the risk of overheating, and this is matched with the above-mentioned experimental knowledge although it is based on rough examinations.

Since an evaporation source 9A having a longitudinally long irradiation area width needs an evaporation surface longer than the longitudinal irradiation area width by about 100 mm, the longitudinal length (long side) of the arc evaporation source for bombardment 9A is suitably set to not less than 500 mm, more preferably to not less than 600 mm. On the other hand, since the length of evaporation source must be within a manufacturable range of target, it is appropriate to set the maximum length of evaporation source to about 2 m or less. Since an excessively increased irradiation area width leads to extension of bombardment treatment time, the irradiation area width for arc evaporation source for bombardment group is preferably set to about 1.2 m or less. If an irradiation area width larger than this is needed, a plurality of arc evaporation sources for bombardment can be juxtaposed in the longitudinal direction and used as the arc evaporation source for bombardment group.

Figure 2A:
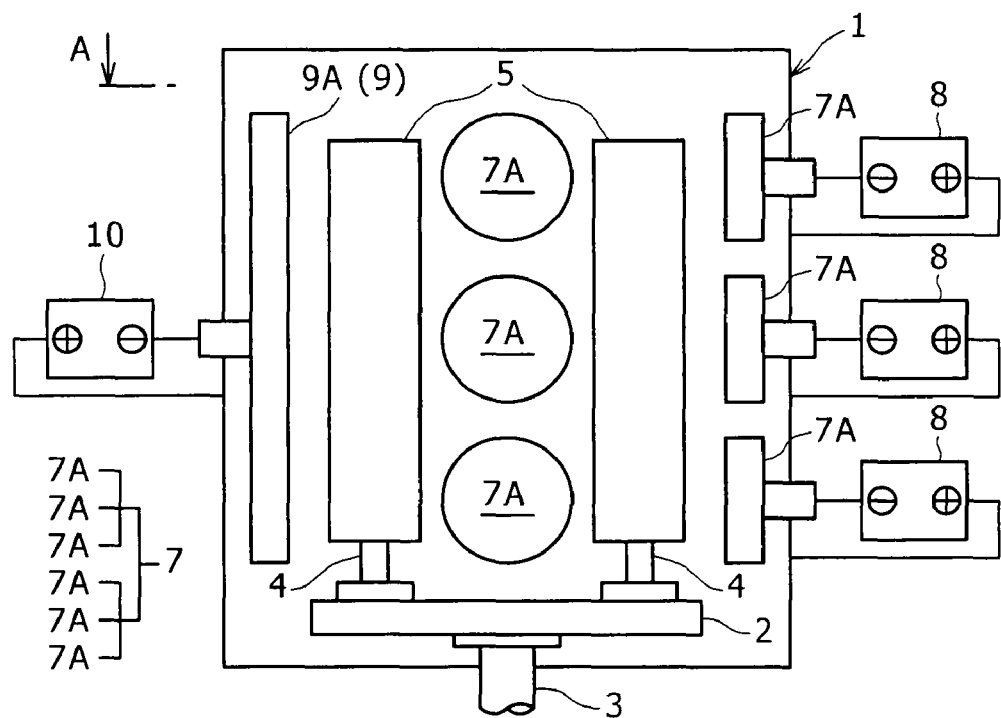
FIGS. 2(A) and (B) schematically illustrate an AIP apparatus according to a second embodiment of the present invention, wherein (A) is a vertically sectional side view of a vacuum chamber, and (B) is a plan view thereof taken from arrowed direction A of (A)
Figure 2B:
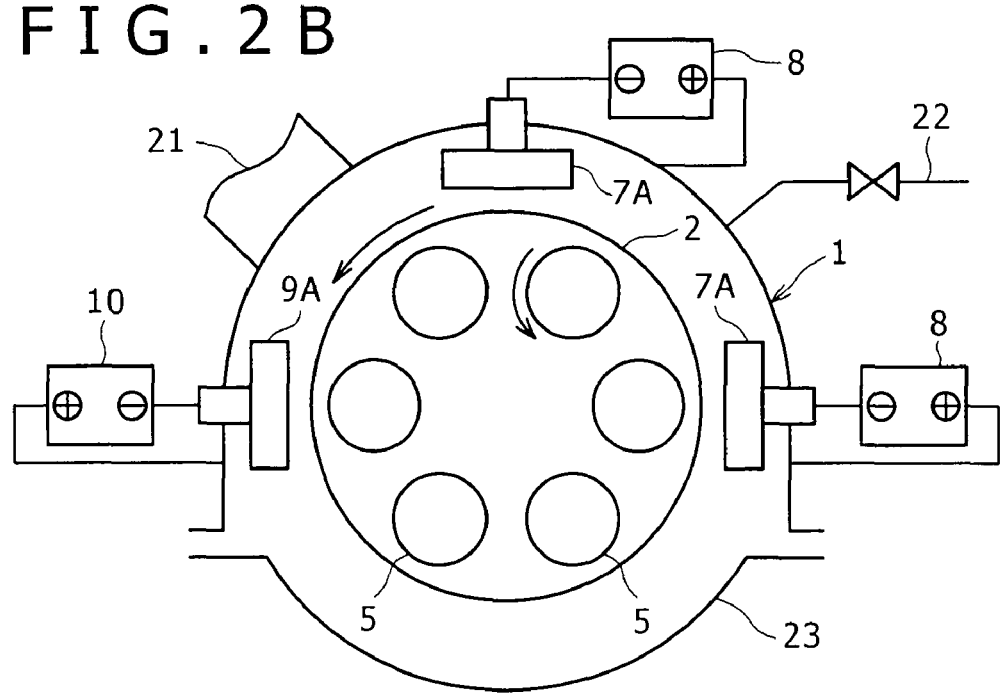

An AIP apparatus according to a second embodiment of the present invention will be briefly described with reference to FIG. 2. In other embodiments which will be described below as well as the second embodiment, the same reference numbers are assigned to the same members as in the AIP apparatus of the first embodiment.

In this AIP apparatus, in contrast to the AIP apparatus according to the first embodiment, two lines of evaporation source groups each composed of three vertically juxtaposed evaporation sources 7A are provided at a distance of 90° in the circumferential direction of the vacuum chamber. In this embodiment, since the film deposition is performed by use of the two lines of evaporation source groups, a two-fold film deposition rate can be realized, compared with the apparatus of the first embodiment. Since the bombardment is performed by use of one rectangular evaporation source 9A similarly to the first embodiment, problems such as overheating are not caused in the bombardment process. Targets of different materials are attached to evaporation sources 7A of each line of the arc evaporation source for deposition group 7, whereby deposition of a multilayer film composed of two kinds of films can be performed.

An AIP apparatus according to a third embodiment of the present invention will be briefly described with reference to FIG. 3. Although the evaporation sources 7A of the arc evaporation source for deposition group 7 are longitudinally lined up in the AIP apparatuses according to the first and second embodiments, the evaporation sources 7A are not necessarily lined up, they may be arranged in the circumferential direction of the vacuum chamber 1, as in this AIP apparatus, while shifting the longitudinal positions stepwise. Even with such an arrangement of the arc evaporation source for deposition group 7, also, uniform coating of substrate surface can be realized by the rotation of the rotary table 2 and the rotation of the substrate holder 5 within the vacuum chamber 1.

Figure 4A:
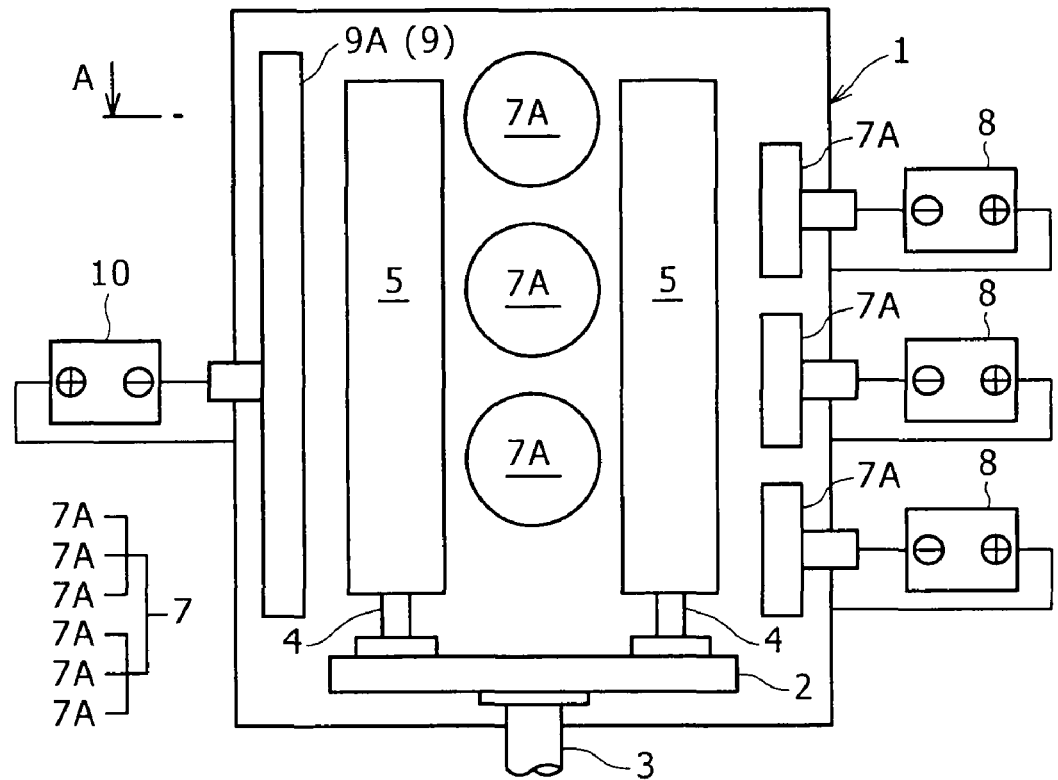
FIGS. 4(A) and (B) schematically illustrate an AIP apparatus according to a fourth embodiment of the present invention, wherein (A) is a vertically sectional side view of a vacuum chamber, and (B) is a plan view thereof taken from arrowed direction A of (A)
Figure 4B:
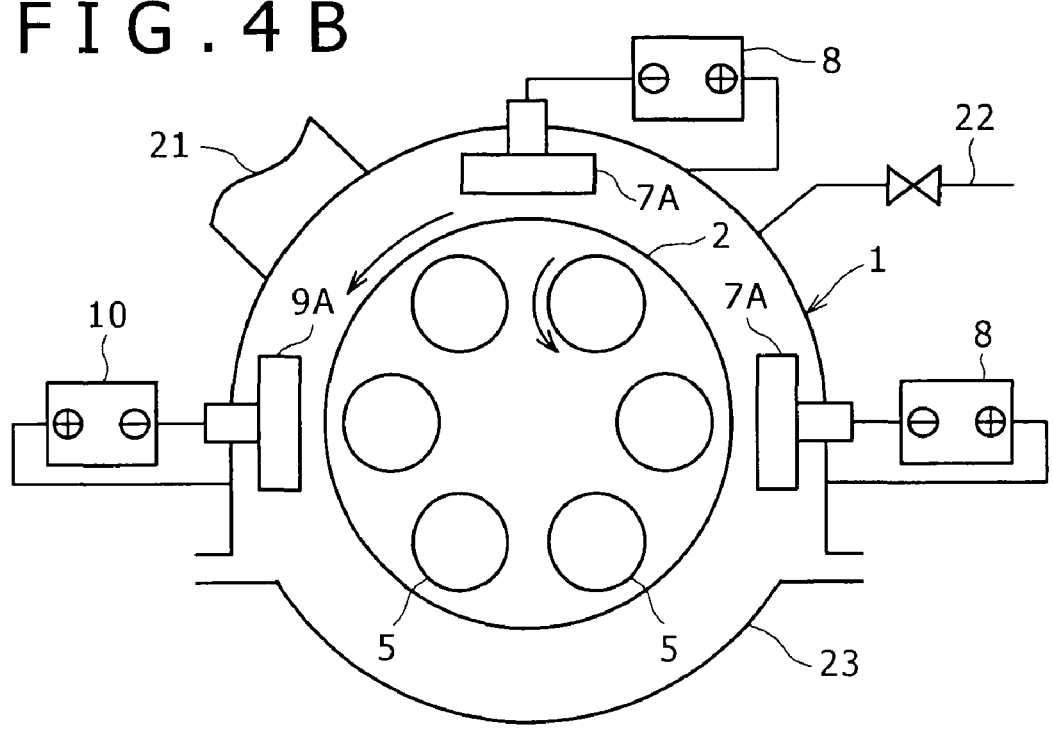

An AIP apparatus according to a fourth embodiment of the present invention will be briefly described with reference to FIG. 4. This AIP apparatus comprises two lines of evaporation source groups each composed of three longitudinal stages of evaporation sources 7A, which are provided in the circumferential direction of the chamber as the arc evaporation source for deposition similarly to the AIP apparatus of the third embodiment, but the evaporation sources 7A of each line are arranged while shifting the longitudinal positions by ½ of the mounting space of the evaporation sources 7A. According to this, coating with further high uniformity can be attained.

Figure 5:
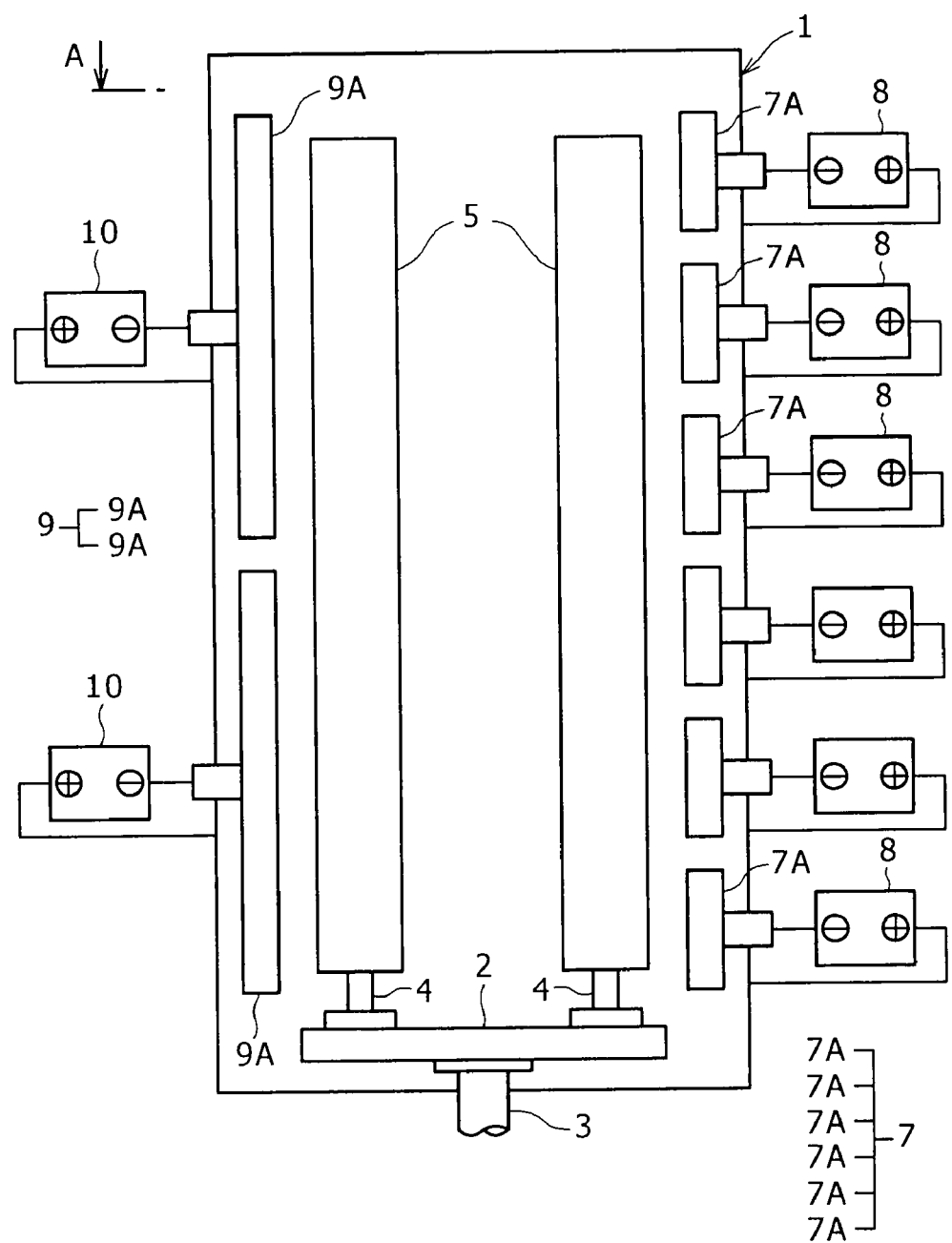
FIG. 5 schematically illustrates an AIP apparatus according to a fifth embodiment of the present invention, and is a vertically sectional side view of a vacuum chamber.

An AIP apparatus according to a fifth embodiment of the present invention will be briefly described with reference to FIG. 5. This AIP apparatus is the same as the AIP apparatus of the first embodiment for the circumferential arrangement of the arc evaporation source for deposition group 7 and the arc evaporation source for bombardment group 9. However, the arc evaporation source for deposition group 7 is composed of six evaporation sources 7A, and the arc evaporation source for bombardment group 9 is composed of two evaporation sources 9A. According to this structure, high-volume treatment can be performed, and the thermal load to substrate in course of bombardment can be reduced to ⅓ of conventional cases.

As the material of the target for arc evaporation source for bombardment, metals including various alloys can be used in the first to the fifth embodiments and, for example, Ti or Cr can be suitably used as the material.

Figure 7:
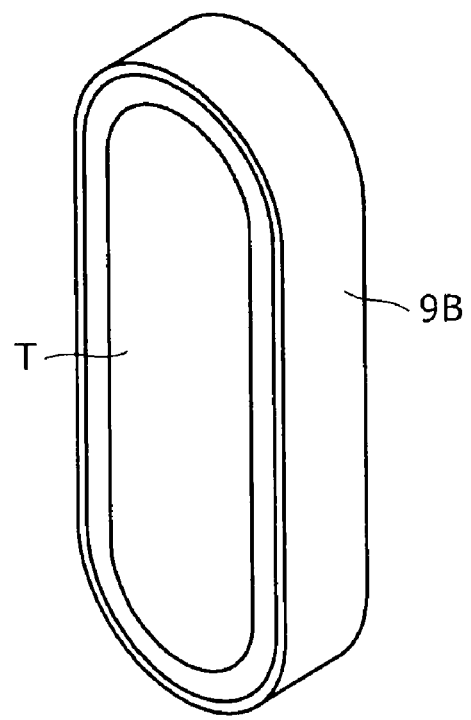
FIG. 7 is a perspective view of an arc evaporation source for bombardment having a race track shape in plan view.
Figure 8A:
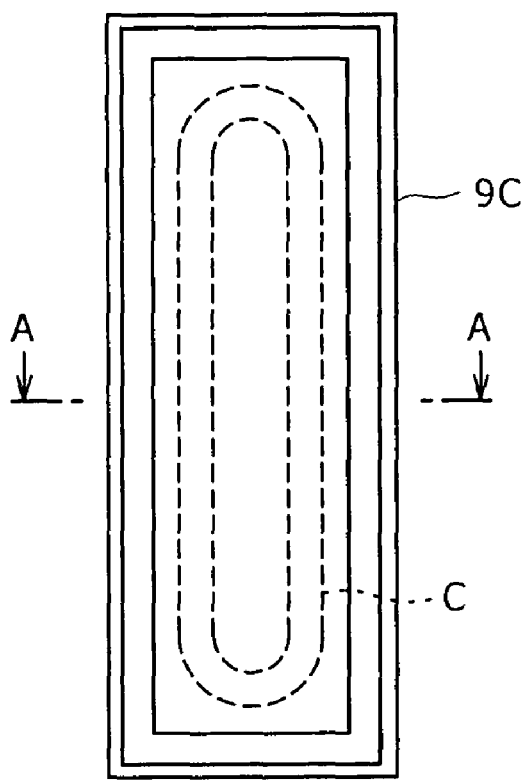
FIGS. 8(A) and (B) illustrate an arc evaporation source for bombardment provided with an electromagnetic coil, wherein (A) is a front view of the arc evaporation source for bombardment and (B) is a sectional view thereof taken along line A-A of (A)
Figure 8B:
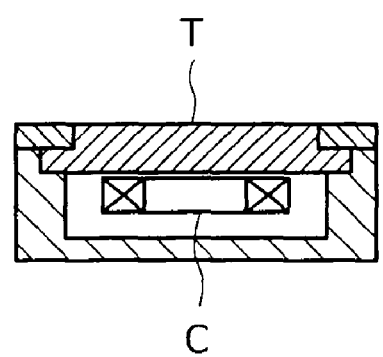

In each of the embodiments, the rectangular evaporation source (the first embodiment evaporation source) shown in FIG. 6 is used as the evaporation source 9A of the arc evaporation source for bombardment group 9. However, the arc evaporation source for bombardment in the present invention is not limited to this and, for example, an evaporation source 9B having a race track-like outer shape in plan view and comprising a target T with a race track-like evaporation surface in plan view as shown in FIG. 7 can be used. The evaporation source 9B is also arranged so that its length (long axis) is laid along the longitudinal direction. Further, as shown in FIGS. 8(A) and (B), an arc evaporation source for bombardment 9C in which a race track-shaped electromagnetic coil is arranged on the back side of the target T can be adapted. By generating a magnetic field by this coil C, an arc spot generated on the evaporation surface can be guided in a race track shape on the evaporation surface of the target. According to this, the vapor to be irradiated from the arc evaporation source for bombardment to the substrate can be further uniformed.

Further, as another embodiment shown in FIGS. 9(A) and (B), an arc evaporation source for bombardment 9D comprising a cylindrically formed target T, both ends thereof being closed by arc closing members 12, and a race track-shaped electromagnetic coil C arranged on the inside of the cylindrical target T as shown in FIG. 9(B) can be adapted. In this evaporation source 9D, a race track-shaped magnetic field is generated by the electromagnetic coil C, whereby the arc spot can be scanned in a race track shape to uniformly irradiate the vapor to the substrate. Further, it is preferable to make the cylindrical target rotatable in a state where the arc spot scanning track corresponding to the coil C arranged in the race track shape is held in a position opposed to the substrate. According to this, the target can be uniformly worn.

In the evaporation sources using electromagnetic coil (e.g., the evaporation sources 9C and 9D), a permanent magnet which forms a magnetic field of a corresponding shape may be arranged on the target surface instead of the electromagnetic coil.

Further, as the arc evaporation source for bombardment, a solid round bar-like target can be arranged in the longitudinal direction and used. In this case, it is preferable to connect negative electrodes of different arc power supplies to both upper and lower ends thereof so as to alternately supply the arc current to be supplied to the evaporation source from both the ends. Since the arc spot for generating vapor on the target tends to be scanned toward the end of the arc current-supplying side, the arc spot can be further extensively scanned over the whole surface of the evaporation surface of the cylindrical target by alternately supplying the arc current to the evaporation source from both the ends, and the metal ion vapor can be uniformly supplied to the substrate.

In each of the above-mentioned embodiments, the arc evaporation source for bombardment has a form in which the longitudinal length (in the height direction of the vacuum chamber) is larger than the lateral length. This reason is that since the vacuum chamber has a round shape in top view from the view of pressure resisting structure, the evaporation surface must be curved if the evaporation source is laterally extended, and this is not realistic. From this point, a longitudinally extended shape is practical for the increase in evaporation surface area of the arc evaporation source for bombardment.

The present invention is not limited to the arc evaporation sources for bombardment or arc evaporation sources for deposition as described in each embodiment. An arc ion plating apparatus comprising a moving member, an arc evaporation source for bombardment and an arc evaporation source for deposition arranged so that irradiation of metal ions to substrate can be effectively performed, in which the arc evaporation source for bombardment is formed so that the evaporation surface area is larger than that of an arc evaporation source for deposition with the largest evaporation surface area of a plurality of arc evaporation sources for deposition, is included in the scope of the present invention. In such an apparatus, the number of arc evaporation sources for deposition is necessarily larger than the number of arc evaporation sources for bombardment. Since the destinations of metal ion irradiation in the bombardment and in the film deposition are the same substrate, the number of evaporation sources must be increased in the film deposition where the irradiation area sharable by one evaporation source is small.

Namely, the present invention mainly aims at providing a structure capable of reducing the metal ion irradiation quantity per unit area by arc evaporation source for bombardment, relative to the minimum current value necessary for stabilization of arc discharge, compared with the metal ion irradiation quantity per unit by arc evaporation source for deposition by setting the evaporation source area of one arc evaporation source for bombardment larger than that of one arc evaporation source for deposition.

Film deposition examples to substrate using the AIP apparatus of the first embodiment will be concretely described. The present invention should not be definitely interpreted by these film deposition examples.

EXAMPLES

Three evaporation sources 7A having an evaporation surface 100 mm in diameter were longitudinally arranged in line as the arc evaporation source for deposition group 7. One evaporation source 9A was used as the arc evaporation source for bombardment group 9. The arc evaporation source for bombardment 9A which has a rectangular shape with a long side of 600 mm and a short side of 100 mm was arranged on the side wall inner surface of the vacuum chamber 1 so that the long side was laid along the longitudinal direction, whereby a longitudinal metal ion irradiation area width opposed to the substrate holder 5 is formed in 500 mm. As the substrates, a high-speed steel-made test piece (dimension: 12 mm×12 mm×5 mm) and a high-speed steel-made drill 3 mm in diameter were loaded on the holder mounted on each planetary shaft 4 of the rotary table 2. A target of Ti was attached to each evaporation source 7A, 9A. The number of revolution of the rotary table 2 in bombardment and film deposition was set to 2 rpm.

As a film deposition example by a conventional method (Conventional Example), bombardment treatment and TiN film deposition were performed in a manner described below using only the arc evaporation source for deposition group without the arc evaporation source for bombardment.

(1) The vacuum chamber was evacuated, and the substrate is heated to a substrate temperature of 400° C. by a radiant heater equipped in the vacuum chamber.

(2) Each evaporation source of the arc evaporation source for deposition group was operated at an arc current of 100 A, and metal bombardment treatment was executed for 5 minutes at a bias voltage of −1000V.

(3) After the bombardment treatment, each evaporation source of the arc evaporation source for deposition group was operated at an arc current of 150 A, a TiN film of about 3 μm was formed at a bias voltage of −50 V while introducing nitrogen gas at a pressure of 3.9 Pa followed by cooling for 30 minutes, and the treated substrate was taken out.

In Conventional Example described above, the time required for film deposition of 3 μm-TiN was 90 minutes, and the total cycle time from the vacuuming start to the taking-out was 3 hours and 15 minutes.

As a film deposition example by a comparative method (Comparative Example), bombard treatment and film deposition treatment were carried out in the following manner using only the arc evaporation source for bombardment.

(1) The same as (1) of the comparative example.
(2) The arc evaporation source for bombardment was operated at an arc current of 100 A, and metal bombardment treatment was executed at a bias voltage of −1000V for 15 minutes.
(3) After the bombardment treatment, the arc evaporation source for bombardment was operated at an arc current of 150 A, a TiN film of about 3 μm was formed at a bias voltage of −50V while introducing nitrogen gas at a pressure of 3.9 Pa followed by cooling for 30 minutes, and the resulting substrate was taken out.

In Comparative Example described above, the time required for film deposition of 3 μm-TiN was about 5 hours, and the total cycle time from the vacuuming start to the taking-out was 7 hours.

Then, as a film deposition example by the original usage of the AIP apparatus of the embodiments (Inventive Example), bombardment treatment using the arc evaporation source for bombardment and film deposition treatment using the arc evaporation source for deposition group were performed in the following manner.

(1) The same as (1) of the conventional example.
(2) The arc evaporation source for bombardment was operated at an arc current of 100 A, and metal bombardment treatment was executed at a bias voltage of −1000V for 15 minutes.
(3) After the bombardment treatment, each evaporation source of the arc evaporation source for deposition group was operated at an arc current of 150 A, TiN film of about 3 μm was formed at a bias voltage of −50V while introducing nitrogen gas at a pressure of 3.9 Pa followed by cooling for 30 minutes, and the resulting substrate was taken out.

In Inventive Example described above, the time required for film deposition of 3 μm-TiN film was 90 minutes, and the total cycle time from the vacuuming start to the taking-out was 3 hours and 25 minutes.

Except Comparative Example which is apparently inferior in productivity, the film depositions in Conventional Example and Inventive Example were evaluated with respect to each item of Table 1. The results are shown together in Table 1.

TABLE 1

| Evaluation Item | Conventional Example | Inventive Example |
| --- | --- | --- |
| Appearance of TiN film on test piece | Satisfactory | Satisfactory |
| Adhesiveness (Rockwell impression method) | Satisfactory | Satisfactory |
| Evaluation for softening of cutting edge in test cutting by φ 3 mm-drill | Softening was observed in about 30% of drills. | No softening was observed. |
| Bias current in bombardment | 13-18A | 5-6A |
| Abnormal discharge | Occurred about 120 times over 3 min. after bombardment start | Occurred about 54 times over 4 min. after bombardment start |
| Others | — | Droplets were reduced compared with conventional film |

As is apparent from Table 1, no significant difference in characteristics was observed for the film on test piece between both the film depositions. However, cutting failure which might be resulted from softening of cutting edge was partially observed in Conventional Example, while such a problem was not caused in Inventive Example.

The bias current is obviously reduced in Inventive Example, and the bombardment treatment could be thus performed by use of a bias power supply of further small capacity. The noticeable point is the abnormal discharge which is sensed by the bias power supply. In Conventional Example, abnormal discharge occurred over 3 minutes in the former stage of the bombardment treatment, and it was only for the final two minutes that application of voltage could be performed without abnormal discharge. Since the bias power supply interrupts output upon detecting abnormal discharge, and restarts voltage applications after resting, a state where normal bias voltage is not applied is established during generation of abnormal discharge. On the other hand, in Inventive Example, the time of applying the normal voltage is relatively extended since the duration of bombardment was about three times in addition to the tendency of reducing the frequency of abnormal discharge, and the reproducibility of the film deposition process was further enhanced.

Further, as a result of microscopic observation of the film on test piece, macro particles mixed in the film were reduced in Inventive Example. This is attributable that since the thermal load per unit area is reduced by the extension of the area of the arc evaporation source for bombardment, the quantity of macro particles generated in course of bombardment was reduced.

We claim:

1. An arc ion plating apparatus, comprising:
a vacuum chamber;
a moving member for moving a substrate loaded within said vacuum chamber, said moving member being provided within said vacuum chamber and moving said substrate in the direction perpendicular to the height direction of said vacuum chamber;
an arc evaporation source for bombardment for irradiating metal ions evaporated by arc discharge from a vertically extending surface of the arc evaporation source for bombardment with the surface of said substrate to clean the surface of said substrate, said arc evaporation source for bombardment being provided within said vacuum chamber; and
an arc evaporation source for deposition for depositing metal ions evaporated by arc discharge from a vertically extending surface of the arc evaporation source for deposition on the surface of said substrate, said arc evaporation source for deposition being provided within said vacuum chamber,
wherein said arc evaporation source for deposition comprises an arc evaporation source for deposition group composed of a plurality of said arc evaporation sources for deposition arranged in opposition to said substrate installed in said moving member without mutually overlapping in the height direction of said vacuum chamber,
said arc evaporation source for bombardment comprises an arc evaporation source for bombardment group composed of at least one arc evaporation source arranged in opposition to said substrate without mutually overlapping in the height direction of said vacuum chamber, and
the length in the height direction of the vertically extending surface of said arc evaporation source for bombardment is longer than the vertically extending surface of said arc evaporation source for deposition by an amount such that a metal ion irradiation quantity per unit length in the vertical direction of the vertically extending surface of the arc evaporation source for bombardment will not cause an abnormal discharge on the substrate at the time of bombardment.

2. The arc ion plating apparatus according to claim 1, wherein the length of the vertically extending surface of said arc evaporation source for bombardment in the height direction of said vacuum chamber is three times more than that of said arc evaporation source for deposition.

3. The arc ion plating apparatus according to claim 2, wherein the length of the vertically extending surface of said arc evaporation source for bombardment in the height direction of said vacuum chamber is 0.5 to 2.0 m.

4. The arc ion plating apparatus according to claim 1, wherein said arc evaporation source for bombardment has a target formed of an evaporating material, and an electromagnetic coil formed long in the height direction of said vacuum chamber is attached to the reverse side of said target.

5. An arc ion plating apparatus, comprising:
a vacuum chamber;
a moving member for moving a substrate loaded within said vacuum chamber, said moving member being provided within said vacuum chamber;
an arc evaporation source for bombardment for irradiating metal ions evaporated by arc discharge from a vertically extending surface of the arc evaporation source for bombardment with the surface of said substrate to clean the surface of said substrate, said arc evaporation source for bombardment being provided within said vacuum chamber; and
a plurality of arc evaporation sources for deposition for depositing metal ions evaporated by arc discharge from a vertically extending surface of the arc evaporation sources for discharge on the surface of said substrate, said arc evaporation sources for deposition being provided within said vacuum chamber,
wherein said arc evaporation source for bombardment is formed so that the evaporation surface area of said vertically extending surface thereof is larger than the evaporation surface area of the vertically extending surface of the an arc evaporation source for deposition having the largest evaporation surface area among a plurality of said arc evaporation sources for deposition.

6. The arc ion plating apparatus according to claim 5, wherein the evaporation surface area of the vertically extending surface of said arc evaporation source for bombardment is three times more than the evaporation surface area of the vertically extending surface of said arc evaporation source for deposition having the largest evaporation surface area among a plurality of said arc evaporation sources for deposition.

7. The arc ion plating apparatus according to claim 5, wherein said moving member moves the substrate which is loaded so that its length direction corresponds to the height direction of said vacuum chamber perpendicular to the height direction of said vacuum chamber;
said arc evaporation source for bombardment makes up an arc evaporation source for bombardment group composed of said arc evaporation source for bombardment arranged in opposition to said substrate without mutually overlapping in the height direction of said vacuum chamber; and said arc evaporation source for deposition makes up an arc evaporation source for deposition group composed of a plurality of said arc evaporation sources for deposition arranged in opposition to said substrate without mutually overlapping in the height direction of said vacuum chamber.

8. The arc ion plating apparatus according to claim 7, wherein said arc evaporation source for bombardment constituting said arc evaporation source for bombardment group have substantially the same dimension, and said arc evaporation sources for deposition constituting said arc evaporation source for deposition group have substantially the same dimension.

9. The arc ion plating apparatus according to claim 5, wherein said arc evaporation source for bombardment has a target formed of an evaporating material, and an electromagnetic coil formed long in the height direction of said vacuum chamber is attached to the reverse side of said target.

10. The arc ion plating apparatus according to claim 7, wherein said arc evaporation source for bombardment group is composed of a plurality of arc evaporation sources for bombardment arranged in opposition to said substrate without mutually overlapping in the height direction of said chamber.

11. The arc ion plating apparatus according to claim 7, wherein said arc evaporation source for bombardment group is composed of one evaporation source opposed to said substrate.

\* \* \* \* \*